United States Patent
Lan et al.

(10) Patent No.: US 9,109,301 B2
(45) Date of Patent: Aug. 18, 2015

(54) CRYSTALLINE SILICON FORMATION APPARATUS

(75) Inventors: Chung-Wen Lan, Hsinchu (TW); Kimsam Hsieh, Hsinchu (TW); Wen-Huai Yu, Hsinchu (TW); Bruce Hsu, Hsinchu (TW); Ya-Lu Tsai, Hsinchu (TW); Wen-Ching Hsu, Hsinchu (TW); Suz-Hua Ho, Hsinchu (TW)

(73) Assignee: Sino-American Silicon Products, Inc., Hsinchu (TW)

( * ) Notice: Subject to any disclaimer, the term of this patent is extended or adjusted under 35 U.S.C. 154(b) by 1224 days.

(21) Appl. No.: 12/637,403

(22) Filed: Dec. 14, 2009

(65) Prior Publication Data

US 2011/0142730 A1   Jun. 16, 2011

(51) Int. Cl.
*C30B 11/02*  (2006.01)
*C30B 11/14*  (2006.01)
*C30B 28/06*  (2006.01)
*C30B 29/06*  (2006.01)

(52) U.S. Cl.
CPC ............ *C30B 28/06* (2013.01); *C30B 29/06* (2013.01)

(58) Field of Classification Search
USPC ............................. 117/81, 82, 83, 222
See application file for complete search history.

(56) References Cited

U.S. PATENT DOCUMENTS

| | | | |
|---|---|---|---|
| 2002/0139296 A1* | 10/2002 | Ohnishi et al. | 117/81 |
| 2004/0261691 A1* | 12/2004 | Doguchi | 117/83 |
| 2008/0174822 A1* | 7/2008 | Kaimi et al. | 358/1.16 |
| 2009/0000536 A1* | 1/2009 | Fujiwara et al. | 117/3 |
| 2012/0282133 A1* | 11/2012 | Liu et al. | 420/579 |

* cited by examiner

*Primary Examiner* — Bob M Kunemund
(74) *Attorney, Agent, or Firm* — Osha Liang LLP

(57) ABSTRACT

In a crystalline silicon formation apparatus, a quick cooling method is applied to the bottom of a crucible to control a growth orientation of a polycrystalline silicon grain, such that the crystal grain forms twin boundary, and the twin boundary is a symmetric grain boundary, and the crystal grain is solidified and grown upward in unidirection to form a complete polycrystalline silicon, such that defects or impurities will not form in the polycrystalline silicon easily.

11 Claims, 8 Drawing Sheets

CRYSTALLINE SILICON FORMATION APPARATUS

BACKGROUND OF THE INVENTION (a) Field of the Invention

The present invention relates to a polycrystalline silicon formation apparatus, and more particularly to a polycrystalline silicon formation apparatus capable of reducing or eliminating defects and impurities.

(b) Description of the Related Art

Solar cell is a kind of semiconductor, and is also known as solar chip, and silicon is a material generally used for manufacturing solar cells, whose power generation principle is to convert solar energy into electric energy. Solar PV cells are made of various different materials including monocrystalline silicon, polycrystalline (or multicrystalline) silicon, amorphous silicon and other non-silicon materials, wherein monocrystalline silicon and polycrystalline silicon are commonly used, and the monocrystalline silicon is composed of atoms arranged according to a specific rule, and each crystal grain in the region of the polycrystalline silicon has its own arrangement, and the structure of a grain boundary between crystal grains is relatively incomplete and accumulated with impurities easily, and thus resulting in a higher detective rate, and affecting the efficiency of converting solar energy into electric energy by the solar cell. The monocrystalline silicon solar cell provides higher conversion efficiency, but it incurs higher manufacturing costs. Although products available in the market at an early stage are still based on the monocrystalline silicon, polycrystalline silicon tends to take over the position of monocrystalline silicon in recent years, since the monocrystalline silicon has a higher cost, and the development of polycrystalline silicon advances to improve the conversion efficiency of polycrystalline silicon and lower the cost of polycrystalline silicon.

With reference to FIG. 7 for a conventional way of forming crystalline silicon, a crystal growing silicon material 14 is placed into a crucible 11 to form a crystal grain 21 in the crucible 11 under the effect of a unidirectional solidification at a heater 12 installed on both sides of the crucible 11 and an external crucible 13 disposed on the external periphery of the crucible 11, and the crystal grain 21 is solidified in unidirection and grown upwardly to form a complete polycrystalline silicon 2 as shown in FIG. 3, and finally the polycrystalline silicon 2 is diced, ground, polished and sliced into a wafer substrate of a specific size and provided for manufacturing the solar chips.

Each crystal grain of the polycrystalline silicon is isolated by a "grain boundary", and most grain boundaries of the polycrystalline silicon formed by the aforementioned conventional method are electro-active grain boundaries, and excited electron holes passing through a region of the electro-active grain boundary are captured and cannot be transferred through an electrode or used, and the region of the electro-active grain boundary becomes invalid. If the excited electron holes pass through a region of an electrically inactive grain boundary, the electron holes will not be recombined. Thus, it is very important to control the electro-passive grain boundary or reduce the electro-active grain boundary in the polycrystalline silicon manufacturing technology. The twin boundary is an electrically inactive grain boundary. The more the twin boundaries, the better the quality of the polycrystalline silicon.

SUMMARY OF THE INVENTION

Therefore, it is a primary objective of the present invention to overcome the aforementioned shortcoming and deficiency of the prior art by providing a polycrystalline silicon formation apparatus capable of reducing or eliminating defects and impurities.

To achieve the foregoing objective, the present invention provides a polycrystalline silicon formation apparatus, and the invention applies a quick cooling method at the bottom of a crucible to control the growth of polycrystalline silicon grains, such that the crystal grains form a twin boundary to reduce electrically active grain boundaries, and the twin boundary is a structure having atoms arranged symmetrically at both ends of the grain boundary, and the crystal grain is solidified in unidirection and grown upward to form a complete polycrystalline silicon, such that reduce defects or impurities in the polycrystalline silicon.

DETAILED DESCRIPTION OF THE PREFERRED EMBODIMENTS

The technical characteristics of the present invention will become apparent with the detailed description of the preferred embodiments and the illustration of the related drawings as follows.

Figure 1:
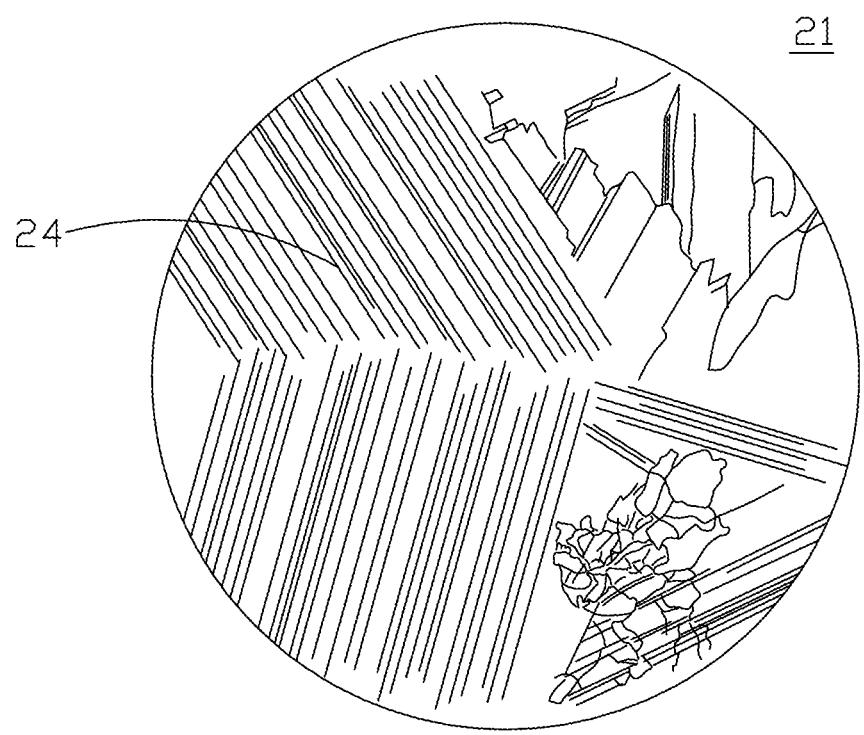
FIG. 1 is a cross-sectional view of a structure of a grain crystal having a twin boundary in accordance with the present invention.
Figure 2:
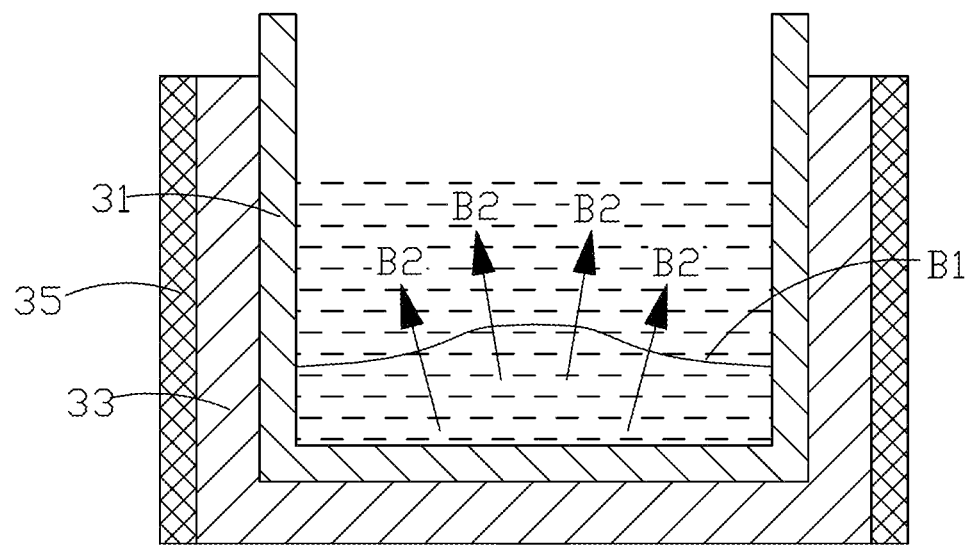
FIG. 2 is a schematic view of a solid/liquid interface and a grain growth orientation of a structure of the present invention.
Figure 3:
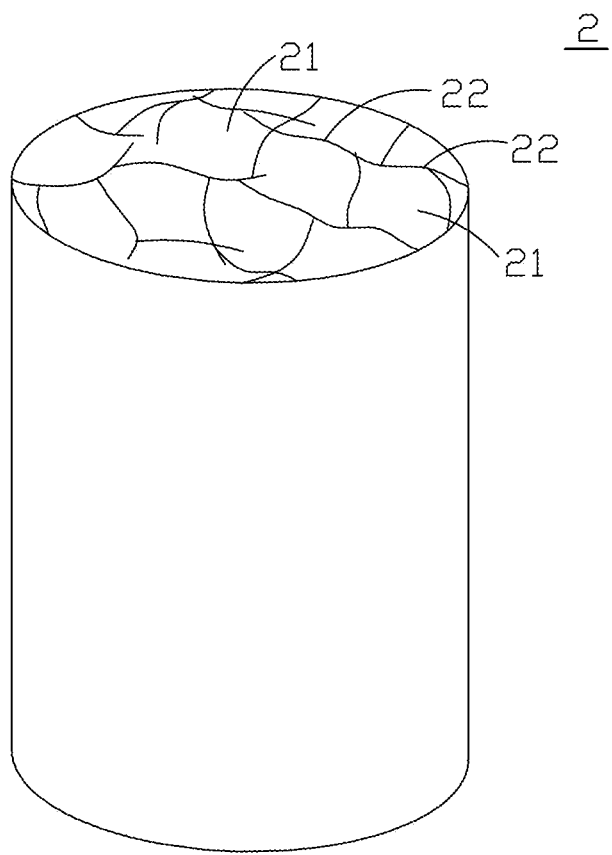
FIG. 3 is a perspective view of a polycrystalline silicon formed in accordance with the present invention.

The present invention discloses a crystalline silicon formation apparatus, wherein a quick cooling method is applied to the bottom of a crucible (such as a position near to the center of the bottom of the crucible) to control the growth orientation of polycrystalline silicon, such as the orientation {112} or {110}, and a crystal grain 21 forms a twin boundary 24 as shown in FIG. 1, and a temperature preserving method is applied to the external periphery of the body of the crucible, such that the heat dissipation flux at a position near to the center of the bottom of the crucible is higher than that of the lateral sides of the crucible, and melt silicon 32 contained in the crucible 31 is solidified to form a solid/liquid interface B1 slightly protruded upwardly from the center of the melt silicon 32 as shown in FIG. 2, an upper part of the solid/liquid interface B1 is in a liquid phase, and a lower part of the solid/liquid interface B1 is in a solid phase, such that the growth orientation B2 of the crystal grain is expanded to the outside to form a larger crystal grain; wherein the twin boundary 24 of the crystal grain 21 is a grain boundary having a symmetric structure, and the crystal grain is solidified in a unidirection and grown upward to form a complete polycrystalline silicon, so that defects or impurities will not form in the polycrystalline silicon easily. With the feature of a large crystal grain, each crystal grain is solidified in a unidirection and grown upward to form a complete polycrystalline silicon as shown in FIG. 3, wherein the polycrystalline silicon has the advantages of less crystal grains 21 and grain boundaries 22 in cross-sectional area, such that recombination effect in silicon wafers caused by dangling bonds derived from the grain boundary can be reduced or eliminated. Particularly, the conversion efficiency of silicon wafers will be enhanced after the grain boundaries (which are impurities inside the wafer) are reduced.

Figure 4:
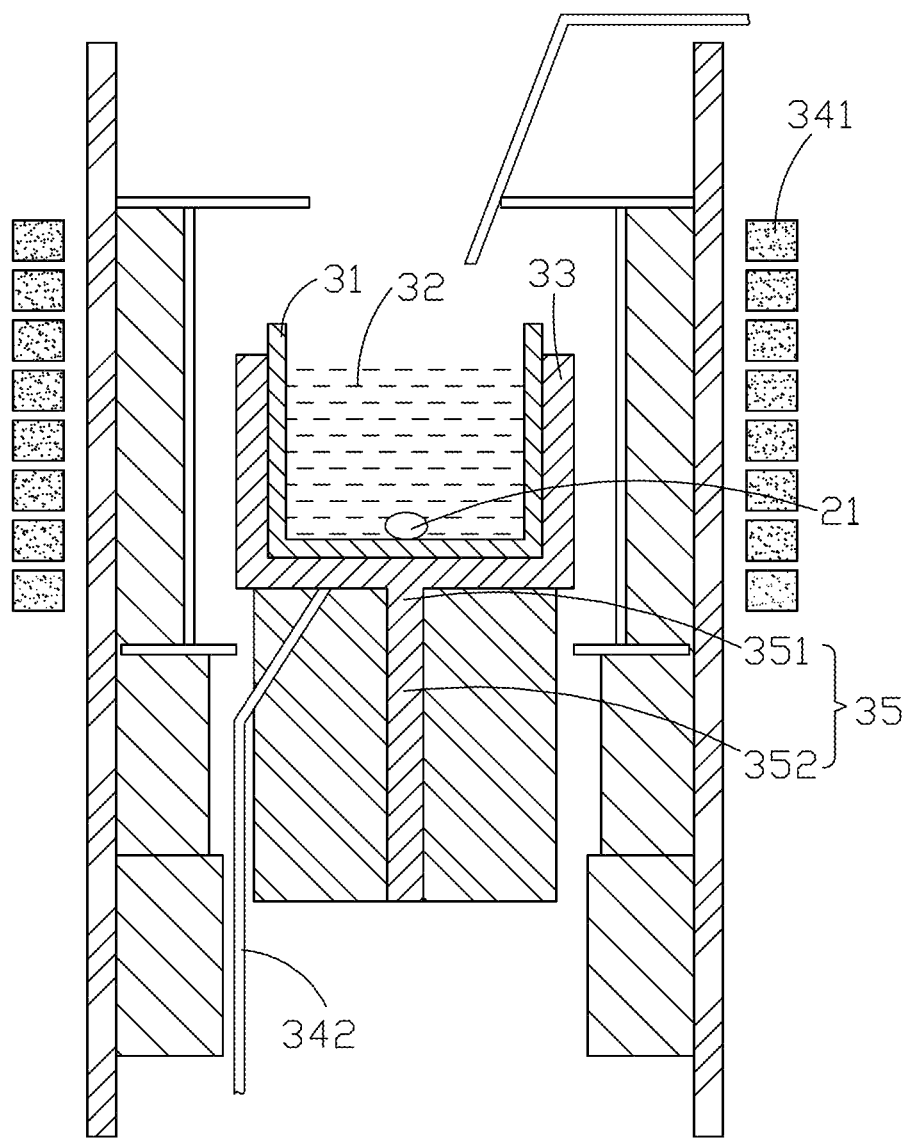
FIG. 4 is a schematic view of a device structure in accordance with a first preferred embodiment of the present invention.

In FIG. 4, the whole formation apparatus comprises a crucible 31 for containing a silicon material 32, an external crucible 33 (made of graphite) for maintaining the shape of the crucible 31 at a high temperature, and a heater installed around the periphery of the crucible 31 (or on lateral sides of the crucible 31 in this preferred embodiment), and including an induction coil 341 and a thermocouple 342 for heating the crucible 31 by induction heating, and the heater can also provide heat by resistance, wherein the external crucible 33 includes a quick cooling device 35 installed outside the external crucible 33 as shown in the FIG. 4, and the quick cooling device 35 is installed at a position of the external crucible 33 at the bottom of the crucible 31. Of course, a plurality of quick cooling devices can be installed at the bottom of the external crucible to provide a plurality of cooling points.

The quick cooling device 35 can be made of a heat dissipating material, and the heat dissipating material includes a contact portion 351 and a heat dissipating portion 352 extended from the contact portion 351, and the contact portion 351 is in contact with the external crucible 33, and the heat dissipating portion 352 has a larger heat dissipation area, and the quick cooling device 35 can be integrally formed with the external crucible 33, and the quick cooling device 35 is extended downwardly from the external crucible 33, and the quick cooling device 35 can be made of graphite.

Figure 5:
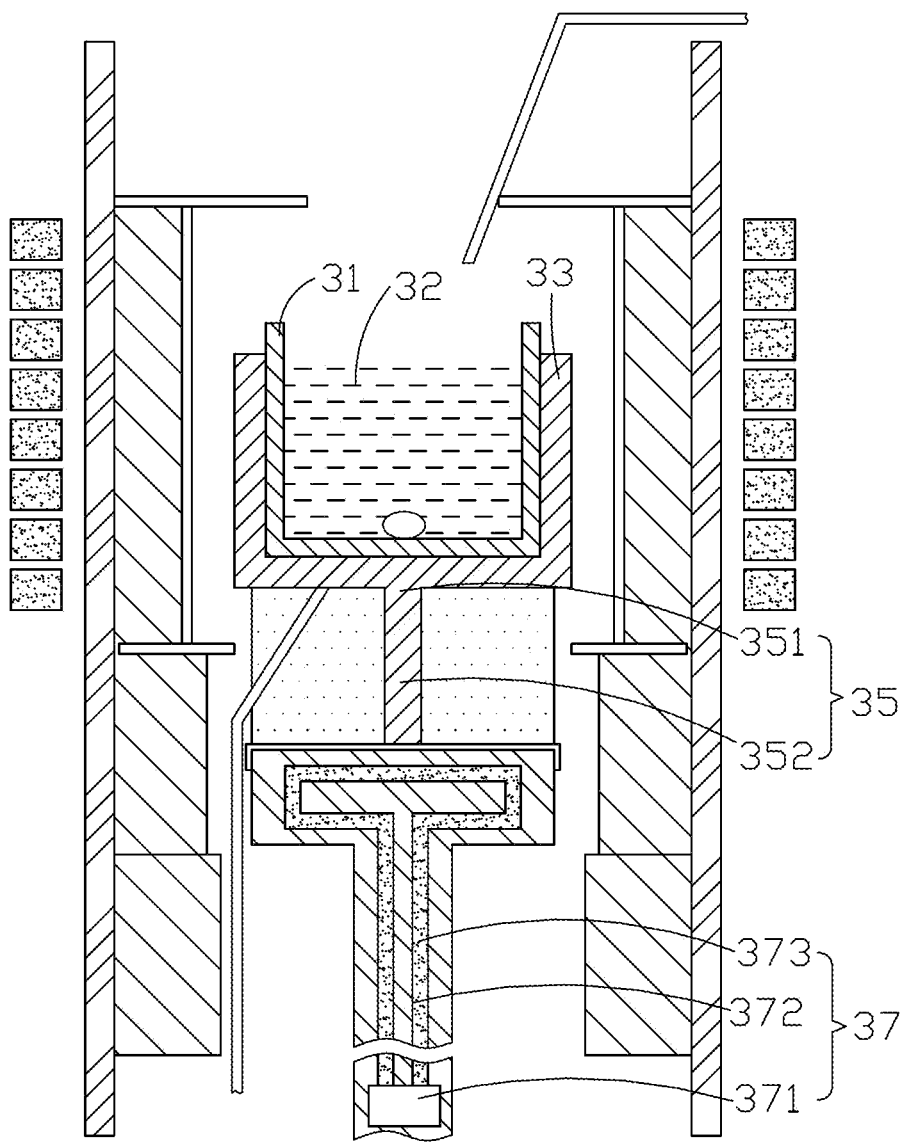
FIG. 5 is a schematic view of a device structure in accordance with a second preferred embodiment of the present invention.

The whole crystalline silicon formation apparatus is operated under the effect of the quick cooling device 35, so that crystal grains 21 having high percentage of twin boundary are formed at the bottom of the crucible 31, and the quick cooling device 35 keeps the bottom of the liquid material contained in the crucible 31 with a heat flux approximately equal to 50~60 W or a temperature gradient approximately equal to 5150~5250 k/m, such that the crystal grains 21 are formed in a specific growth orientation such as the grain orientation {112} or {110}, and the crystal grains 21 with more twin boundaries are formed. Of course, the formation apparatus can further comprise a cooling module 37 as shown in FIG. 5, and the cooling module 37 is coupled and contacted with the quick cooling device 35 as shown in FIG. 5. In a preferred embodiment, the cooling module 37 is in contact with a heat dissipating portion 352 of the quick cooling device 35, so that the cooling module 37 can dissipate the heat of a heat source of the quick cooling device 35, and the cooling module 37 further comprises a controller 371, a circulation pipe 372 and a fluid 373 (which is either a liquid or a gas) contained in the circulation pipe 372, and the controller 371 is provided for controlling a flow speed of the fluid 373 in the circulation pipe 372 in order to control the cooling condition of the quick cooling device 35.

Figure 6:
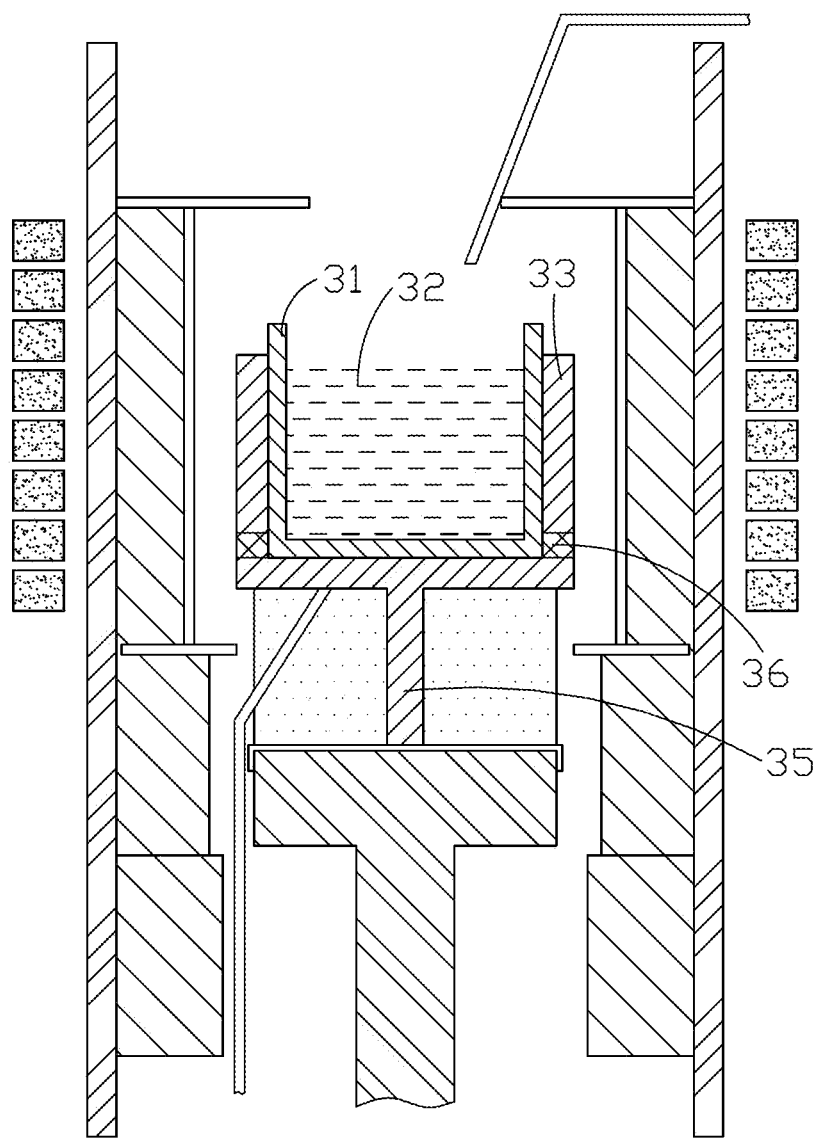
FIG. 6 is a schematic view of a device structure in accordance with a third preferred embodiment of the present invention.
Figure 7:
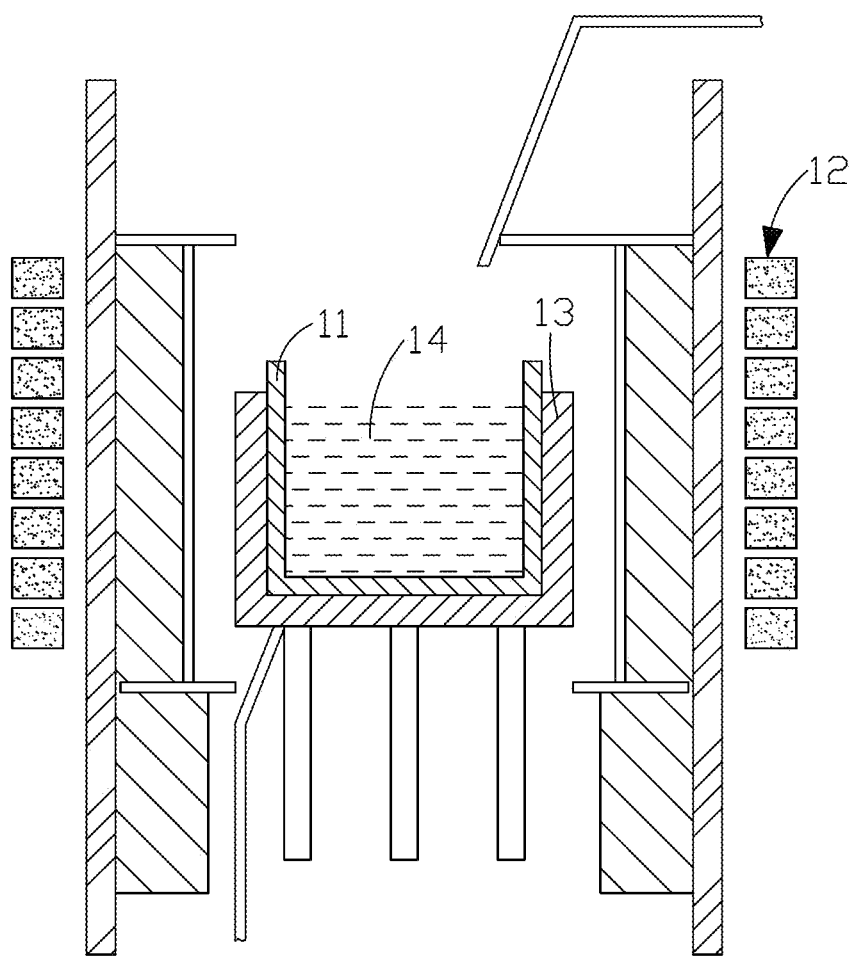
FIG. 7 is a schematic view of a structure formed by a conventional silicon crystal formation technology.

The formation apparatus further comprises a temperature preserving device 36 (made of carbon fiber, aluminum oxide or zirconium oxide) as shown in FIG. 6, and the temperature preserving device 36 is covered around the periphery of the bottom of the crucible 31, such that a crystal grain 21 is formed at the bottom of the crucible 31. Since the temperature preserving device 36 is installed at the external periphery of a body of the crucible 31, the efficiency of dissipating the heat from the heat source of the external crucible 33 is lowered, and the temperature at the center of the bottom of the crucible 31 is less than both sides of the crucible 31, and thus a solid/liquid interface B1 is formed and protruded slightly from the middle as shown in FIG. 2, and a growth orientation B2 of the crystal grain is perpendicular to the solid/liquid interface B1, so that the growth orientation B2 of the crystal grain is expanded outward to form a larger crystal grain.

Since the present invention forms a crystal grain with a high percentage of twin boundaries at the bottom of the crucible, therefore defects and impurities will not form in the polycrystalline silicon easily. With the large crystal grain, each crystal grain is solidified in a unidirection and grown upward to form a complete polycrystalline silicon having the advantages of less crystal grains and less grain boundaries in cross-sectional area, so that a recombination effect of silicon wafers caused by dangling bonds derived from the grain boundary can be reduced or eliminated. Particularly, the conversion efficiency of silicon wafer will be enhanced after the grain boundaries (which are impurities inside wafer) are reduced.

Figure 8:
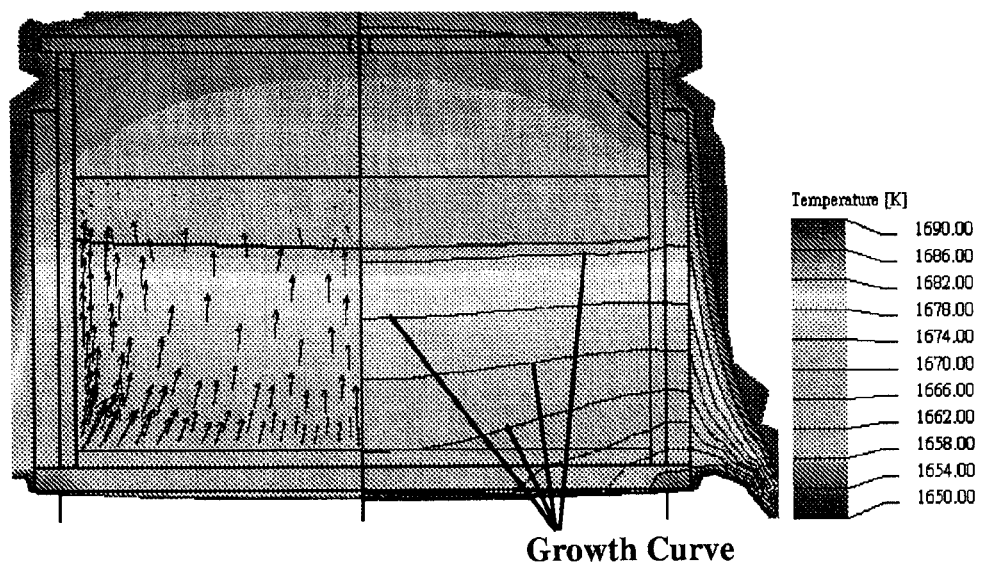
FIG. 8 is a growth curve comparing conventional silicon crystal formation technology and an embodiment of the present invention.

The conventional crystalline silicon formation method and the crystalline silicon method of the present invention are compared as shown in FIG. 8

In FIG. 8, a crystal growing silicon material is placed into a crucible, and a heater is installed on both sides of the crucible, and an external crucible is disposed outside the crucible. In a heating process, a heat flux at the bottom of the crucible is equal to 46.867 W, and a temperature gradient at the bottom of the crucible is equal to 400 klm, and the growth curve of a growth with unidirectional solidification and an upward growth which solid/liquid interface tends to be flat.

Figure 9:
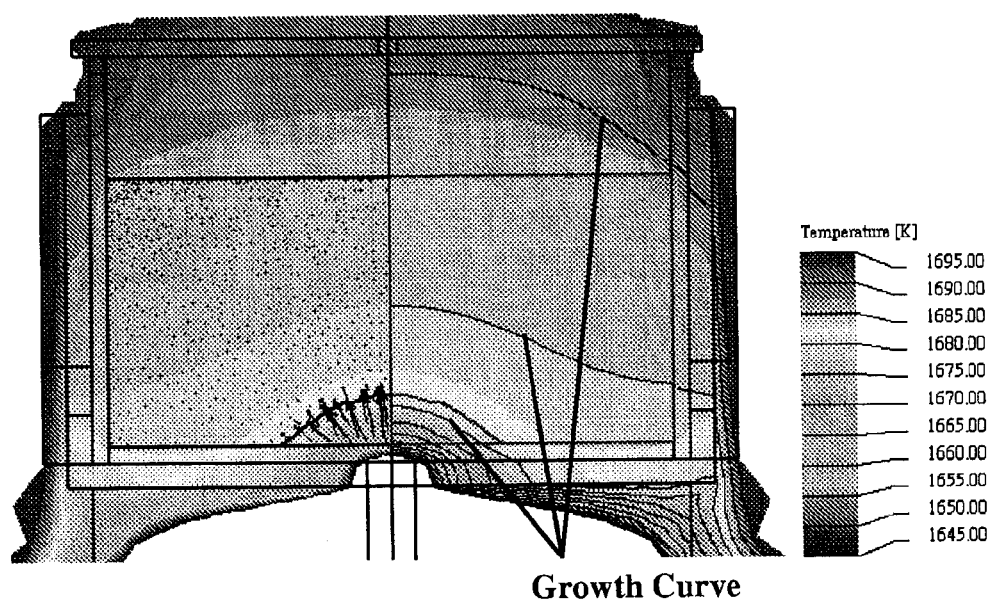
FIG. 9 is a growth curve in accordance with another embodiment of the present invention.

In FIG. 9, a crystal growing silicon material is placed into a crucible, and a heater is installed on both sides of the crucible, and an external crucible is disposed outside the crucible. A quick cooling method is applied to the bottom of the crucible (such as a position near to the center of the bottom of the crucible) to control orientation of the polycrystalline silicon grains. In a heating process, a heat flux at the bottom of the crucible is equal to 54.887 W, and a temperature gradient at the bottom of the crucible is equal to 5189.09 k/m, such that the crystal grains having larger percentage of twin boundary are formed at the bottom of the crucible, and the growth curve of a growth with a unidirectional solidification and an upward growth is protruded slightly upward from the middle.

In summation of the description above, the present invention provides a feasible crystalline silicon formation method and its formation apparatus and complies with the patent application requirements, and thus the invention is duly filed for patent application.

While the invention has been described by device of specific embodiments, numerous modifications and variations could be made thereto by those generally skilled in the art without departing from the scope and spirit of the invention set forth in the claims.

We claim:

1. A crystalline silicon formation apparatus, comprising:
a crucible, for containing a silicon material;
an external crucible, covered onto a body of the crucible;
a heater, installed around the crucible;

a plurality of quick cooling device, installed at a position of the external crucible at the center of the bottom of the crucible to provide a plurality of cooling points, such that a quick cooling method is applied to the bottom of the crucible through the plurality of quick cooling device to control orientation of a polycrystalline silicon grain, and the crystal grain forms twin boundary; and a temperature preserving device covered around the periphery of the bottom of the crucible, such that the crucible has a higher heat dissipation flux at a position near to the center of the bottom of the crucible than that of lateral sides of the crucible, such that a crystal growing liquid material contained in the crucible is solidified to form solid/liquid interface protruded slightly upward from the middle.

2. The crystalline silicon formation apparatus of claim 1, wherein the orientation of the polycrystalline silicon grain is {112} or {110}.

3. The crystalline silicon formation apparatus of claim 1, wherein the crucible has a heat flow of 50~60 W at the bottom of the crucible.

4. The crystalline silicon formation apparatus of claim 1, wherein the crucible has a temperature gradient of 5150~5250 k/m at the bottom of the crucible.

5. The crystalline silicon formation apparatus of claim 1, wherein the quick cooling device is made of a heat dissipating material, and the heat dissipating material includes a contact portion and a heat dissipating portion extended from the contact portion, and the contact portion is in contact with the external crucible, and the heat dissipating portion has a greater heat dissipating area.

6. The crystalline silicon formation apparatus of claim 5, wherein the quick cooling device is integrally formed with the external crucible, and extended downwardly from the external crucible.

7. The crystalline silicon formation apparatus of claim 1, wherein the external crucible is made of graphite.

8. The crystalline silicon formation apparatus of claim 1, further comprising a cooling module coupled and contacted with the cooling module for dissipating a heat source of the quick cooling device.

9. The crystalline silicon formation apparatus of claim 8, wherein the cooling module includes a controller, a circulation pipe and a fluid contained in the circulation pipe, and the controller is provided for controlling a flow speed of the fluid in the circulation pipe.

10. The crystalline silicon formation apparatus of claim 1, wherein the temperature preserving device is made of a material selected from the collection of carbon fiber, aluminum oxide and zirconium oxide.

11. The crystalline silicon formation apparatus of claim 1, wherein the heater includes an induction coil and a thermocouple.

* * * * *